US006636226B2

(12) United States Patent  (10) Patent No.: US 6,636,226 B2
Morein et al.  (45) Date of Patent: Oct. 21, 2003

(54) METHOD AND APPARATUS FOR CONTROLLING COMPRESSED Z INFORMATION IN A VIDEO GRAPHICS SYSTEM

(75) Inventors: Steven L. Morein, Cambridge, MA (US); Michael T. Wright, Marlborough, MA (US); Kin M. Yee, Quincy, MA (US)

(73) Assignee: ATI International Srl (BB)

( * ) Notice: Subject to any disclaimer, the term of this patent is extended or adjusted under 35 U.S.C. 154(b) by 0 days.

(21) Appl. No.: 10/303,593

(22) Filed: Nov. 25, 2002

(65) Prior Publication Data

US 2003/0085893 A1 May 8, 2003

Related U.S. Application Data

(63) Continuation of application No. 09/369,730, filed on Aug. 6, 1999, now Pat. No. 6,492,991, which is a continuation-in-part of application No. 09/356,790, filed on Jul. 20, 1999, now Pat. No. 6,407,741, which is a continuation-in-part of application No. 09/141,797, filed on Aug. 28, 1998, now Pat. No. 6,188,394.

(51) Int. Cl.[7] .............................. G06T 9/00; G09G 5/36
(52) U.S. Cl. ...................... 345/555; 345/422; 345/557; 382/232
(58) Field of Search ................................ 345/422, 421, 345/501, 530, 545, 557, 555, 561–563, 598, 599; 382/232–234

(56) References Cited

U.S. PATENT DOCUMENTS 5,729,669 A   3/1998   Appleton
5,808,618 A   9/1998   Kawano et al.
6,188,394 B1  2/2001   Morein et al.
6,407,741 B1  6/2002   Morein et al.

FOREIGN PATENT DOCUMENTS

JP   06036045   10/1994
JP   08123980   5/1996

Primary Examiner—Kee M. Tung
(74) Attorney, Agent, or Firm—Vedder, Price, Kaufman & Kammholz, P.C.

(57) ABSTRACT

A method and apparatus for managing compressed Z information in a video graphics system is described. Pixels in a display frame are grouped into a plurality of pixel blocks, where each pixel block includes a plurality of pixels. When possible, the Z information corresponding to the plurality of pixels in a pixel block is compressed and stored in a Z buffer in a compressed format. A Z mask value for each pixel block in the frame is stored in a Z mask memory, where the Z mask for each pixel block indicates a level of compression of the Z information for each of the pixel blocks. When Z information for a pixel block is required for processing operations, a cache is first examined to determine if the Z information for the pixel block is included in the cache. If the Z information is not included in the cache, the Z mask memory is consulted to determine the level of compression of the Z information for the particular pixel block. Based on the indication provided by the Z mask memory as to the level of compression, a predetermined amount of data is retrieved from the Z buffer, and when the Z information is in compressed format, it is decompressed. The fetched Z information is then stored in the cache for use in video graphics processing.

31 Claims, 5 Drawing Sheets

METHOD AND APPARATUS FOR CONTROLLING COMPRESSED Z INFORMATION IN A VIDEO GRAPHICS SYSTEM

RELATED APPLICATION

This application is a Continuation of U.S. patent application Ser. No. 09/369,730, entitled "Method and Apparatus for Controlling Compressed Z Information in a Video Graphics System", filed Aug. 6, 1999 now U.S. Pat. No. 6,492,991, which is a Continuation-in-part of U.S. patent application Ser. No. 09/356,790 filed Jul. 20, 1999 U.S. Pat. No. 6,407,741, entitled "Method and Apparatus for Controlling Compressed Z Information in a Video Graphics System that Supports Anti-Aliasing", issued Jun. 18, 2002, which is a Continuation-in-part of U.S. patent application Ser. No. 09/141,797 filed Aug. 28, 1998, now U.S. Pat. No. 6,188,394, entitled "Method and Apparatus for Video Graphics Antialiasing", issued Feb. 13, 2001.

FIELD OF THE INVENTION

The invention relates generally to video graphics processing and more particularly to a method and apparatus for managing compressed Z information in a video graphics system.

BACKGROUND OF THE INVENTION

Computers are used in many applications. As computing systems continue to evolve, the graphical display requirements of the systems become more demanding. This is especially true in the area of three-dimensional (3D) graphics processing. In order to process 3D graphics images, the position of graphics primitives with respect to the display must be understood in all three dimensions. This includes the dimension of depth, often referred to as the Z dimension. The Z dimension describes the positioning of a video graphics primitive with respect to other video graphics primitives within the display frame in terms of the depth, or distance from the viewer, of the video graphics primitives.

Computer displays and other high resolution display devices such as high definition televisions (HDTVs), projectors, printers, plotters, and the like, present an image to the viewer as an array of individual picture elements, or pixels. The individual pixels are given a specific color, which corresponds to the color of the image at the location of the particular pixel. The pixels are closely spaced, and the viewer's visual system performs a filtering of individual pixel colors to form a composite image. If the partitioning of the image into individual pixel elements is performed properly, and the pixels are close enough together, the viewer perceives the displayed array of pixels as a virtually continuous image.

In order to present a smooth and continuous image on the display, the processing entity processing the video graphics images must maintain a high rate of pixel processing. In order to achieve high rates of pixel processing, pixel data stored in memory must be retrieved, processed, and then stored back in the memory in an efficient manner. Pixel fragments that are received include a Z value and a color value corresponding to the fragment. These fragments also include X and Y coordinates that specify, with respect to the display frame, the particular pixel with which the fragment corresponds. The Z value of the fragment is compared with a stored Z value for the particular pixel, and if it is determined that the fragment is located in front of the pixel (the Z value of the fragment indicates less spatial depth), the Z value and color value corresponding to the fragment must be written in the memory that stores the data corresponding to that particular pixel. Typically, the memory storing the pixel information is referred to as the frame buffer.

In an example system that requires a 100 megapixel-per-second (100 M pixels/sec) pixel processing rate, the worst case scenario is the case where all of the fragments received are located in front of the pixels currently stored in the frame buffer. In such a scenario, 100 M read operations are required (on a per second basis) to fetch the Z data for the pixels from the frame buffer. If it is assumed that each Z value and each color value for a particular pixel requires two bytes, the rate of Z value reads from the frame buffer required to perform the comparison with the fragments will be 200 M bytes/sec. If all of the fragments are located in front of the pixel Z values currently stored, another 200 M bytes/sec will be required to store the Z values for the fragments in the frame buffer. Finally, if all of the fragments are in front of the current frame buffer information, 100 M color write operations per second will be required as the color values for the fragments must be stored in the frame buffer. Once again, if two bytes are required to store each color value, another 200 M bytes/sec of memory bandwidth is required. Thus, in the worst case scenario, the total memory bandwidth required for a 100 M pixels/sec rate is 600 M bytes/sec.

Assuming a more typical scenario in which 50 percent of the Z comparisons between the fragments and the currently stored pixel information result in the fragment data replacing the pixel data, the memory bandwidth requirements will be reduced to 400 M bytes/sec. This is due to the fact that the number of writing operations to the frame buffer will be cut in half. Even with this assumption in place, the amount of memory bandwidth required to perform 3D video graphics processing is substantial.

More memory bandwidth translates into increased cost. This can be due to the requirement for faster, more expensive memories or more memories that can operate in parallel. Parallel memory structures are undesirable as they add complexity to the system and can increase costs of manufacturing 3D graphics processing systems.

Therefore, a need exists for a method and apparatus for reducing the memory bandwidth requirements in a 3D video graphics system.

DETAILED DESCRIPTION OF A PREFERRED EMBODIMENT OF THE INVENTION

Generally, the present invention provides a method and apparatus for managing compressed Z information in a video graphics system such that memory bandwidth requirements of the video graphics system are reduced. This is accomplished by separating pixels in a display frame into a plurality of pixel blocks, where each pixel block includes a plurality of pixels. When possible, the Z information corresponding to the plurality of pixels in a pixel block is compressed and stored in a Z buffer in a compressed format. A Z mask value for each pixel block in the frame is stored in a Z mask memory, where the Z mask for each pixel block indicates the level of compression of the Z information the corresponding pixel block. When Z information for a pixel block is required for processing operations, a cache is first examined to determine if the Z information for the pixel block is included in the cache. If the Z information is not included in the cache, the Z mask memory is consulted to determine the level of compression of the Z information for the particular pixel block. Based on the indication provided by the Z mask memory as to the level of compression, a predetermined amount of buffered Z information is retrieved from the Z buffer, and when the Z information is in compressed format, it is decompressed. The fetched Z information is then stored in the cache for use in video graphics processing.

By compressing the Z information in the Z buffer when possible, the amount of memory bandwidth required to retrieve the Z information for each pixel block in the frame is reduced. The Z buffer is preferably structured such that each pixel block of the frame is assigned a predetermined amount of memory within the Z buffer such that the location of the information for each pixel block in the Z buffer is always known, and adequate space for storage of uncompressed Z information for each pixel block is provided. Although this is inefficient in terms of usage of memory storage capacity, it improves the speed and simplicity of control with which the compressed or uncompressed Z information stored in the Z buffer can be retrieved and stored.

Figure 1:
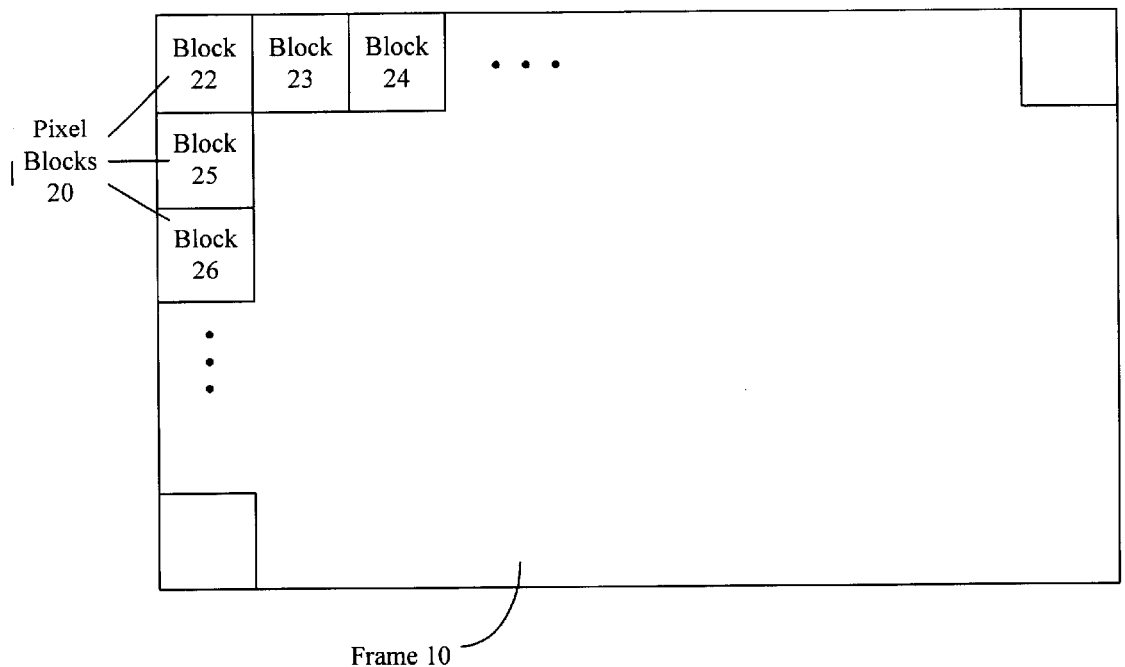
FIG. 1 illustrates a block diagram of a frame divided into a plurality of pixel blocks in accordance with the present invention.

The invention can be better understood with reference to FIGS. 1–6. FIG. 1 illustrates a frame 10 that is divided into a plurality of pixel blocks 20. The pixel blocks 20 shown in FIG. 1 are illustrated as square blocks that, when combined, make up the entire pixel space of the frame 10. It should be noted that the particular shape of the pixel blocks 20 can be modified to suit different compression algorithms used to compress the Z values for the pixels within each of the pixel blocks. Thus, rectangular blocks or other shapes may be appropriate.

Each of the pixel blocks 20 includes a plurality of pixels. The number of pixels included in each pixel block can be selected based on the screen resolution, the compression algorithm utilized to compress the Z information, or the particular application in which the Z information management circuitry is being utilized.

Figure 2:
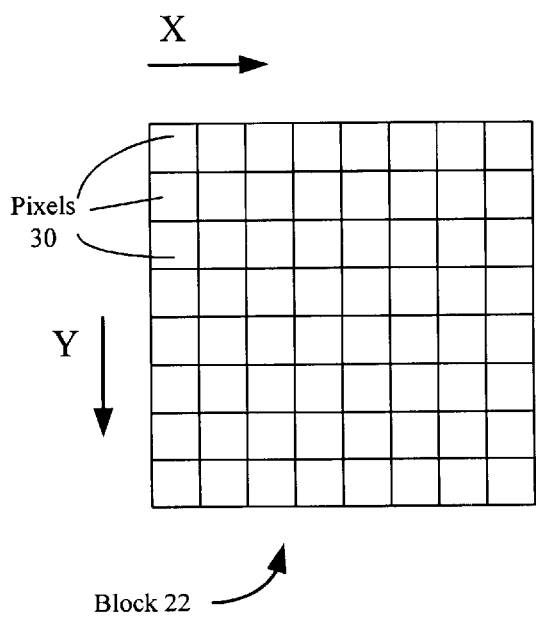
FIG. 2 illustrates a block diagram of a pixel block that includes a plurality of pixels in accordance with the present invention.

FIG. 2 illustrates a block diagram of one pixel block 22 of the plurality of pixel blocks 20 that makes up the frame. The block 22 is shown to include a plurality of pixels 30. The block 22 as illustrated in FIG. 2 is shown to include 64 pixels, arranged in an 8-by-8 grid. The X and Y directions are shown for reference. Each of the pixels 30 includes a color value and a Z value corresponding to the particular pixel. As stated earlier, the Z value determines the depth value of the particular pixel with respect to the viewer. Thus, pixels with greater depth with have either higher or lower Z values than pixels with less depth, depending upon the orientation of the Z-axis. Although the number of pixels within a pixel block can vary, the pixel block 22 that includes 64 pixels will be used as an example pixel block for illustrative purposes. An 8-by-8 pixel block is preferable because it provides a reasonable balance between latency and granularity losses and the level of compression possible. Latency and granularity losses increase as the block size increases, whereas the level of compression possible typically improves with the increases in block size.

Figure 3:
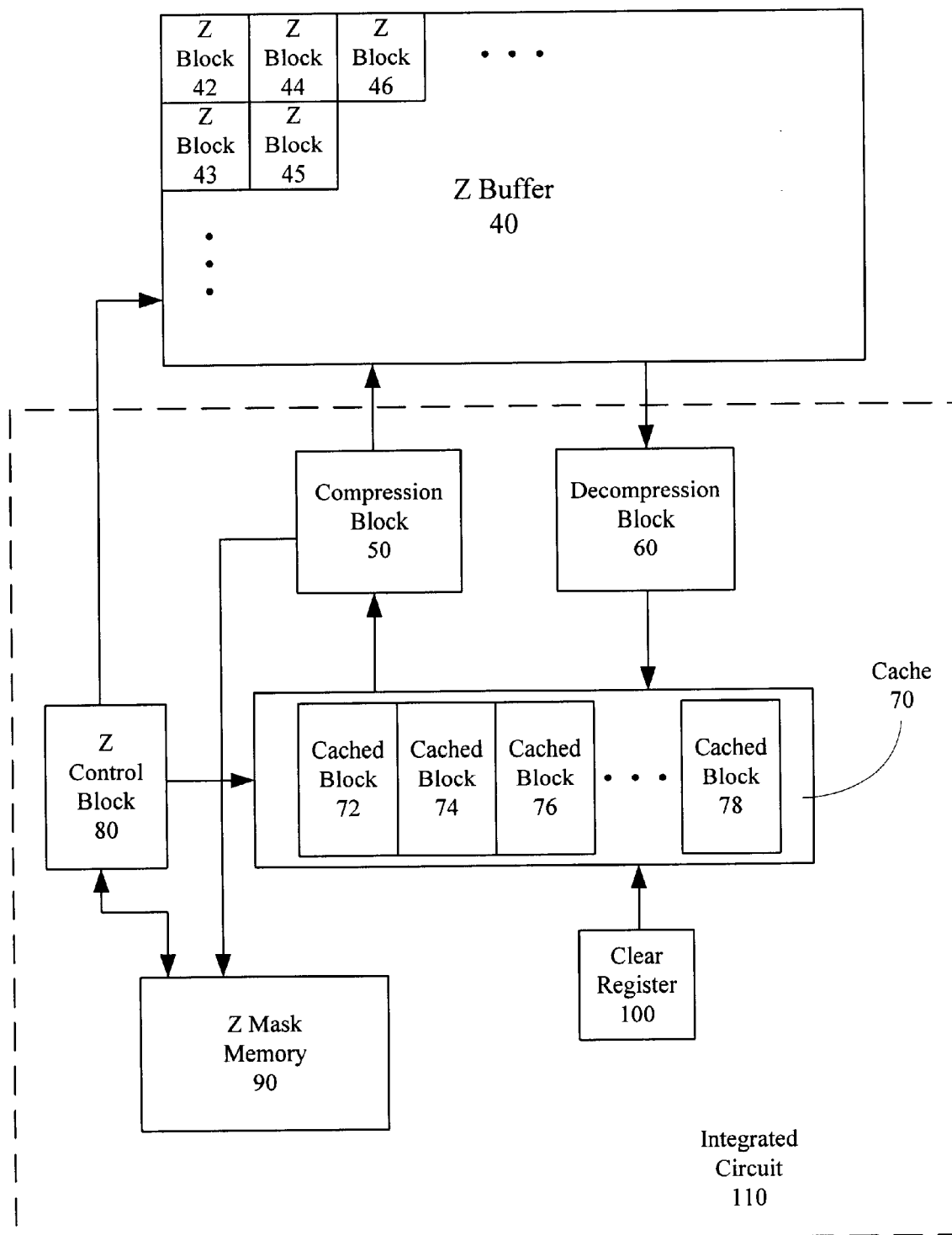
FIG. 3 illustrates a block diagram of a circuit for processing Z information in accordance with the present invention.

FIG. 3 illustrates a block diagram of a circuit for processing Z information that is preferably included in a video graphics circuit that may be implemented on a video graphics card for use in a personal computer. The circuit of FIG. 3 includes a cache 70, a Z mask memory 90, a Z buffer 40, a Z control block 80, a decompression block 60, and preferably a compression block 50.

The cache 70 stores Z information corresponding to a cached set of pixel blocks of the frame. Thus, the cache 70 includes cached blocks 72–78, where each cached block includes Z information in an uncompressed format corresponding to one of the plurality of pixel blocks 20 of the frame 10. Preferably, the cache 70 includes enough storage space to store N pixel blocks where N is a number. The number N may be chosen based on the number of pixel blocks included in the frame, or the die area or circuitry available for implementation of the cache 70. In one embodiment, the value of N is ten such that ten pixel blocks are stored in uncompressed format in the cache.

The Z mask memory 90 stores a Z mask value for each of the plurality of pixel blocks of the frame. Preferably, the Z mask memory is a lookup table that stores the compression level for each of the pixel blocks. Each Z mask value indicates a level of compression of the Z information for a corresponding pixel block. The Z buffer 40 stores buffered Z information for each pixel block of the frame 10. The Z information for a pixel block includes at least one Z value for each pixel. Although the examples discussed herein include a single Z value for each pixel, multiple Z values may be included for each pixel if some type of oversampling technique is being utilized. An oversampling technique may store more than one Z value for each pixel, and in that case the Z buffer 40 would include multiple Z values per pixel.

The buffered Z information is preferable stored in a compressed format when possible. Many different compression techniques can be applied to compress the Z information for each of the pixel blocks. One such technique is discussed in detail in a co-pending patent application Ser. No. 09/387,870 entitled "Method and Apparatus for Compressing Parameter Values for Pixels in a Display Frame" filed on Sep. 1, 1999 and having an attorney docket number of 0100.990077.

The Z control block 80 is operably coupled to the cache 70, the Z buffer 40, and the Z mask memory 90. The Z control block 80 receives coordinates corresponding to a selected pixel in the frame and determines if Z information for that selected pixel is currently included in one of the cached blocks 72–78 currently stored in the cache 70. The Z control block 80 would typically receive a request for the Z information for a particular pixel from a backend render block or some other block that processes pixel data. If the pixel block that includes the pixel for which the coordinates have been received is one of the cached blocks 72–78, the Z information for that pixel can be retrieved directly from the cache and utilized by the requesting entity.

However, if the pixel is not included in one of the pixel blocks for which Z information is currently stored in the cache 70, the Z information for that particular block is retrieved and placed in the cache 70. This is accomplished by reading the Z mask value from the Z mask memory 90 that corresponds to the pixel block that includes the selected pixel. The Z mask indicates the level of compression of the Z information in the Z buffer 40 for the selected pixel block that includes the selected pixel. Based on this, the Z control block 80 can read the appropriate amount of buffered Z information from the location corresponding to the selected pixel block in the Z buffer 40.

The information read from the Z buffer 40 is then provided to the decompression block 60. When the buffered Z information is stored in a compressed format, which is indicated by the mask value read from the Z mask memory 90, the decompression block 60 decompresses the buffered Z information prior to storing it in one of the cache blocks 72–78. When the decompression block 60 overwrites a cached block that has been altered since it was read from the Z buffer 40, the block within which this altered data has been stored will be flushed from the cache and re-compressed via the compression block 50 prior to being stored in the Z buffer 40. The compression block 50 will store a new compression level for the particular block in the Z mask memory 90. An example below will further clarify the functionality of the compression block 50.

An example which illustrates the functionality of the circuitry of FIG. 3 begins with the cache memory 70 storing cached Z information corresponding to pixel blocks 22, 23, 24, and 25 of FIG. 1. If the Z control block 80 receives coordinates corresponding to a pixel in any one of the blocks 22–25, the information is present within the cache 70 and can simply be read and utilized. However, assume that the Z control block receives pixel coordinates corresponding to a pixel located within pixel block 26 of FIG. 1. At this point, the Z control block 80 will reference the Z mask memory 90 to ascertain the level of compression of the Z information in the Z buffer 40 corresponding to the pixel block 26. Assuming that the Z blocks 42–46 stored in the Z buffer 40 correspond to the pixel blocks 22–26, respectively, the Z mask corresponding to pixel block 26 will indicate the level of compression of the Z information included in the Z block 46 stored in the Z buffer 40.

The various levels of compression can be indicated in a number of ways. Preferably, an M bit value encodes $2^M$ potential compression levels. Thus, if two bits are included in each Z mask, four different levels of compression can be encoded in each Z mask. The table below illustrates three different potential compression level encodings.

| ENCODING BITS | COMPRESSION LEVEL | | |
| --- | --- | --- | --- |
| 00 | 128 | 256 | Clear |
| 01 | 256 | 512 | 512 |
| 10 | At least 384 | 1024 | 768 |
| 11 | Uncompressed | Uncompressed | Uncompressed |

The first encoding scheme would most likely be used in a memory system that fetches 128-bit blocks from the Z buffer 40. Thus, if the Z mask stored a 00, only one block would need to be fetched. If a 01 was encoded, two blocks would be fetched. If a 10 was stored in the Z mask, at least three blocks would be fetched, and preferably those three blocks would store an additional indication as to how much additional data must be fetched for that particular Z block. The level encoded with the value 11 indicates that the Z data for that particular block is uncompressed, and no decompression would be required. When the Z data is uncompressed, the data contained in the entire amount of memory dedicated that that particular block in the Z buffer would have to be fetched and stored in the cache.

The second encoding scheme is similar to the first, but the granularity of fetching is 256 bits rather than 128 bits. It may be that in this particular Z buffer the minimum block fetch is 256 bits. Note that the minimum block fetch is typically going to affect the different levels of compression that the Z masks will encode. This, however, is not a requirement.

The final encoding scheme in the right-most column shows that an encoding value of 00 indicates that the Z values for that particular pixel block are cleared Z values. A cleared Z value indicates that any fragment corresponding to that pixel will overlay whatever is there and the Z value of the fragment should be stored in place of the cleared value. When this is indicated, rather than fetching an array of cleared values from the Z buffer 40, a clear register 100 may be utilized by the cache 70 to load a cached block with a set of clear values. Thus, a clear value will be stored in the cache as the Z value corresponding to each of the plurality of pixels in the pixel block to which the Z mask corresponds. Note that the encoding levels 01, 10, and 11 are similar to the other encoding schemes in that the granularity of compression is based on a 256-bit block, but the minimal fetch is two 256-bit blocks. Thus, an encoding of 10 will fetch three blocks, and an encoding of 11 will fetch the entire block of data stored in the Z buffer 40.

Continuing with the example, if the Z information for the pixel block 26 that has been read from the Z buffer 40 is to be stored in the cached block 72, the current contents of the cached block 72 must be stored back into the Z buffer 40. This assumes that the information within the cached block 72 has been altered in some way since it was read from the Z buffer 40. Determining whether or not the data has been modified can be accomplished by using a dirty bit for each block entry in the cache 70. Thus, if data stored in the cache block 72 has been altered since it was loaded in the cache 70, the dirty bit will be set. When the information in the cache block 72 is flushed to make room for data being read from the Z buffer 40, the dirty bit will be examined to determine whether or not the data must be written back to the Z buffer 40. If the dirty bit is clear, the data has not been modified and the copy of the data stored in the Z buffer is current and does not need to be replaced.

If the dirty bit is set, the information stored in the cached block 72 will be provided to the compression block 50 which will attempt to compress the Z information. Assuming that the data can be compressed, the compression block 50 will store the compressed set of Z information in the correct entry within the Z buffer 40, where the correct entry corresponds to the particular pixel block to which the Z information corresponds. The compression block 50 will also update the Z mask for that pixel block in the Z mask memory 90 to reflect the current level of compression of the buffered Z information for the pixel block.

The compression block 50 may have a threshold that it used to judge its attempts to compress Z information. If the compression block 50 cannot compress a cached block to the point that it exceeds this compression threshold, it will not compress the block at all. In those cases, it will store the block in uncompressed format in the Z buffer 40. Such a compression threshold can be used to ensure that the overhead associated with compressing and decompressing the data does not exceed the overhead of simply storing and retrieving the data in uncompressed format.

Once again, it should be noted that the Z buffer 40 is preferably divided into a plurality of Z blocks, where each Z block is capable of storing the Z information for a particular pixel block in uncompressed format. Thus, each pixel block of the frame 10 has an associated area of memory in the Z buffer 40 for storage of its Z information. The blocks are sized to suit the worst case condition where no compression is possible. When compression is possible, only a portion of the memory space for the particular pixel block will be utilized. Although somewhat wasteful of storage capacity, the assignment of particular areas of memory to each of the pixel blocks provides the advantage of always knowing where the Z information for a particular pixel block is located. An additional advantage is the guarantee that if a compressed set of Z information is modified so it can no longer be compressed to the same degree, there will still be adequate space assigned to that particular pixel block to store the uncompressed, or less-well-compressed, Z information. In addition to these advantages, the variable compression levels provided by the system could create a large amount of overhead in terms of management if the storage space for particular pixel blocks in the memory varied in terms of size or location.

As stated earlier, the circuit of FIG. 3 is preferably included in a video graphics circuit that may be included on a video graphics card for use in a personal computer. More preferably, all of the components of the circuit of FIG. 3 other than the Z buffer 40 are preferably implemented on a single integrated circuit 110. The implementation of these circuit elements on an integrated circuit allows for more efficient interaction between the various circuit components. Although current technology makes it possible to include the Z buffer 40 in the integrated circuit, it may not be economically feasible due to the additional die area, testing, and potential for defects that the addition of the memory adds. However, as integrated circuit processing and design techniques are further advanced, it may become more practical to include the Z buffer 40 in the integrated circuit 110.

Figure 4:
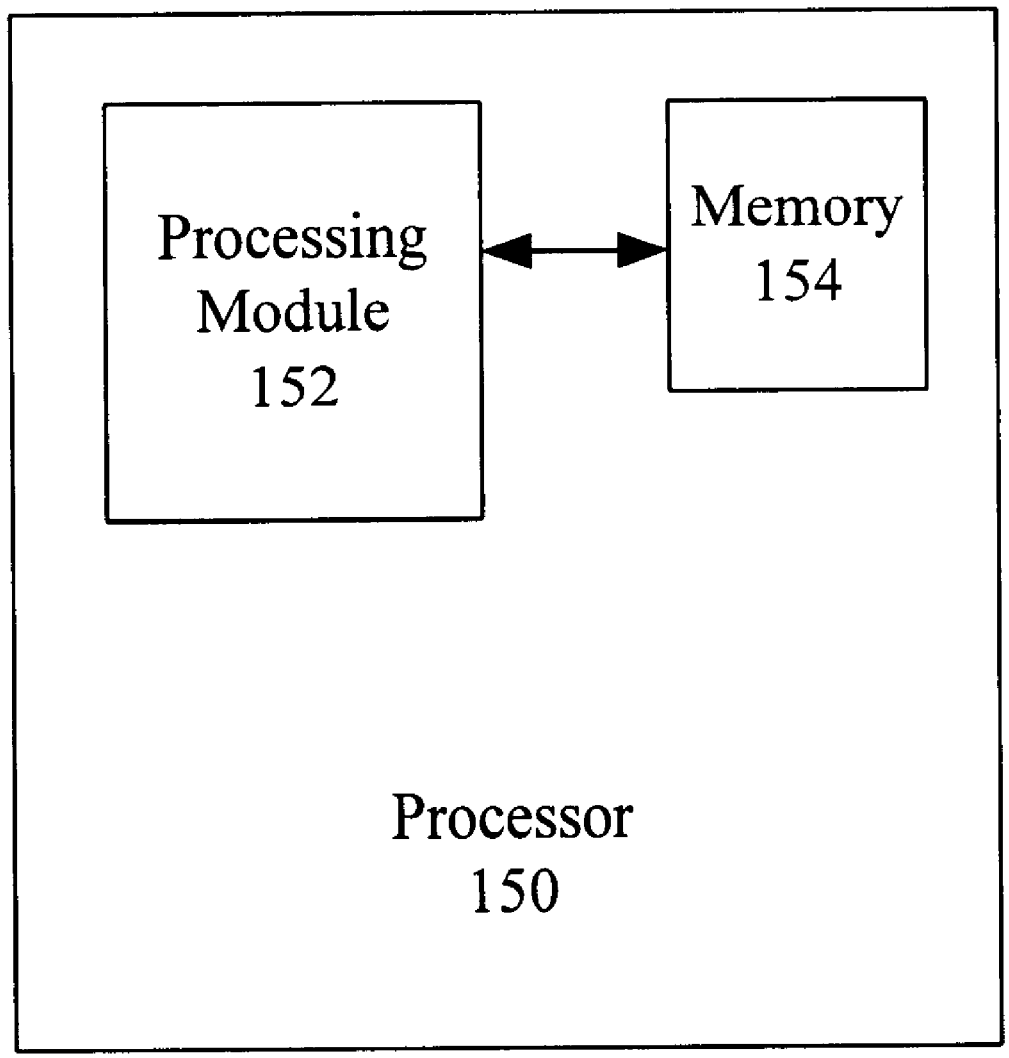
FIG. 4 illustrates a block diagram of a processor for managing compressed Z information in accordance with the present invention.

FIG. 4 illustrates a processor 150 that may be used for managing compressed Z information in a video graphics circuit. The processor 150 includes a processing module 152 and memory 154. The processing module may include a single processing entity or a plurality of processing entities. Such a processing entity may be a microprocessor, microcontroller, digital signal processor, state machine, logic circuitry, and/or any device that processes information based on operational and/or programming instructions. The memory 154 may be a single memory device or a plurality of memory devices. Such a memory device may be a read only memory device, random access memory device, floppy disk, hard drive memory, and/or any device that stores digital information. Note that when the processing module 152 has one or more of its functions performed by a state machine and/or logic circuitry, the memory containing the corresponding operational instructions is embedded within the state machine and/or logic circuitry.

Figure 5:
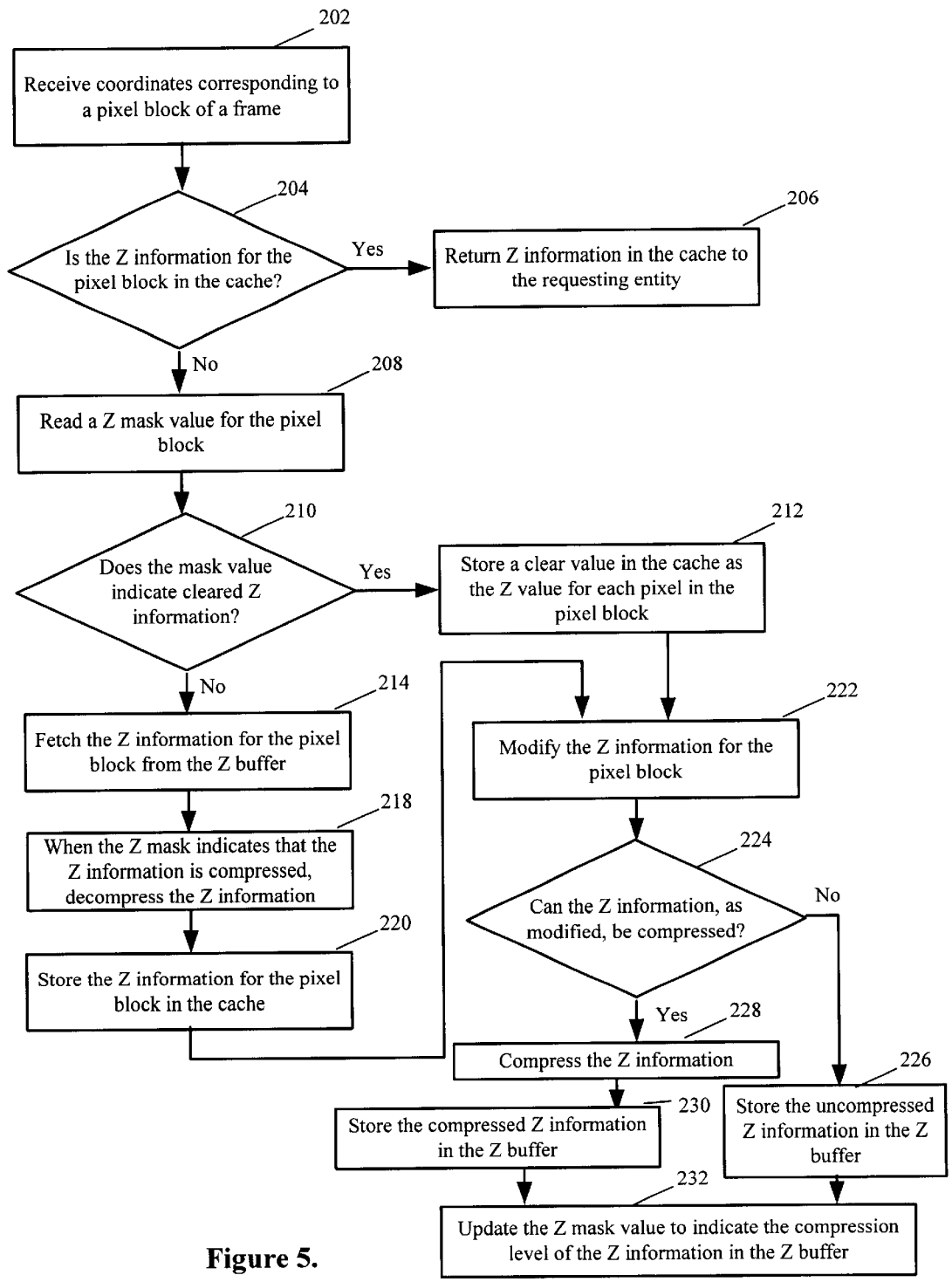
FIG. 5 illustrates a flow diagram of a method for controlling compressed Z information in accordance with the present invention.

The memory 154 stores programming and/or operational instructions that, when executed, allow the processing module 152 to perform the method illustrated in FIG. 5. Note that the processor 150 may implement some of the functions of FIG. 5 through software stored in the memory 154, whereas other portions maybe implemented using hardware, or circuitry included within the processor 150. Thus, in some embodiments, a mix of hardware and software may be used to perform the method illustrated in FIG. 5.

FIG. 5 illustrates a method for controlling, or managing, compressed Z information in a video graphics system. The method begins a step 202 where coordinates corresponding to a pixel block of a frame are received. The coordinates may correspond to a single pixel, where the pixel block to which the coordinates correspond is determined based on which pixel block includes the identified pixel. As before, the frame includes a plurality of pixel blocks, and each pixel block of the plurality of pixel blocks includes Z information for a plurality of pixels. The Z information for each pixel represents the spatial depth of the pixel with respect to the display.

At step 204, it is determined whether or not the Z information for the pixel block is currently present in a cache. If it is determined at step 204 that the Z information for the particular pixel block is in the cache, the method proceeds to step 206, where the Z information in the cache can be returned to the requesting entity for use. If it is determined at step 204 that the Z information for the pixel block is not included in the cache, the method proceeds to step 208.

At step 208, a Z mask value for the pixel block is read from a Z mask memory that stores Z mask values for the plurality of pixel blocks that make up the frame. At step 210, it is determined whether or not the Z mask indicates that the Z information for the pixel block is cleared Z information. If it is determined at step 210 that the Z information for the pixel block is cleared Z information, the method proceeds to step 212 where a clear value is stored in the cache as the Z value for each pixel in the pixel block. If the determination at step 210 shows that the Z information for the pixel block is not cleared Z information, the method proceeds to step 214.

At step 214, the Z information for the pixel block is fetched from the Z buffer. The Z mask value read at step 208 indicates a level of compression of the Z information for the pixel block in the Z buffer. Knowing the level of compression of the Z information allows the Z information to be fetched from the Z buffer in an efficient manner. Thus, if the Z information for the particular pixel block has been compressed to a significant degree, much less memory bandwidth will be required to fetch the Z information for the pixel block.

At step 218, when the Z mask value indicates that the Z information for the pixel block is stored in the Z buffer in a compressed format, the compressed Z information is decompressed to produce uncompressed Z information. At step 220, the Z information for the pixel block is stored in uncompressed format in the cache. The uncompressed Z information stored in the cache can then be utilized by the requesting entity to perform whatever video graphics processing for which the Z information was required.

The method of FIG. 5 preferably includes steps 222–232 that correspond to modification and storage of Z information included in the cache. At step 222, Z information for the pixel block stored in the cache is modified. The modification may be the result of video graphics processing operations. When space within the cache is needed for the Z information corresponding to a different pixel block, at least a portion of the cache must be flushed and the Z information currently stored in the flushed location may have to be stored back into the Z buffer. When the Z information corresponding to at least one of the plurality of pixels included in the pixel block has been modified, the information in the Z buffer must be updated. If no modification has occurred, there is no need to overwrite the Z information for the pixel block currently stored in the Z buffer.

Assuming that the Z information in the Z buffer for the pixel block must be updated, at step 224, it is determined whether or not the Z information being flushed from the cache can be compressed. This comparison preferably determines whether or not the Z information can be compressed to a level that exceeds a compression threshold. Preferably, the compression threshold determines the point at which compression of the Z information reduces the overall overhead required to maintain the Z information for that particular pixel block.

If it is determined that the Z information cannot be efficiently compressed at step 224, the method proceeds to step 226 where the Z information is stored in uncompressed format in the Z buffer. If it is determined at step 224 that the Z information can be efficiently compressed, the method proceeds to step 228 where the Z information is compressed. The compression performed at step 228 may be performed using a variety of compression techniques that are well known in the art. These techniques take advantage of regularity or consistency within the set of Z values for a particular pixel block, and allow the information to be compressed in a lossless manner that results in fewer bits being required to store the Z information for the entire pixel block. At step 230, the compressed Z information is stored in the Z buffer.

At step 232, the Z mask corresponding to the pixel block is updated. The Z mask is updated to reflect the current compression level for the Z information for that particular pixel block in the Z buffer. As was described with respect to FIG. 3, the Z masks for each of the pixel blocks may be made up of one or more bits, where the bits encode the level of compression. Preferably, enough bits are used to allow for a variety of different compression levels. More preferably, two bits are used to encode four levels of compression, and one of the four levels of compression indicates that no compression of the Z information has occurred.

Figure 6:
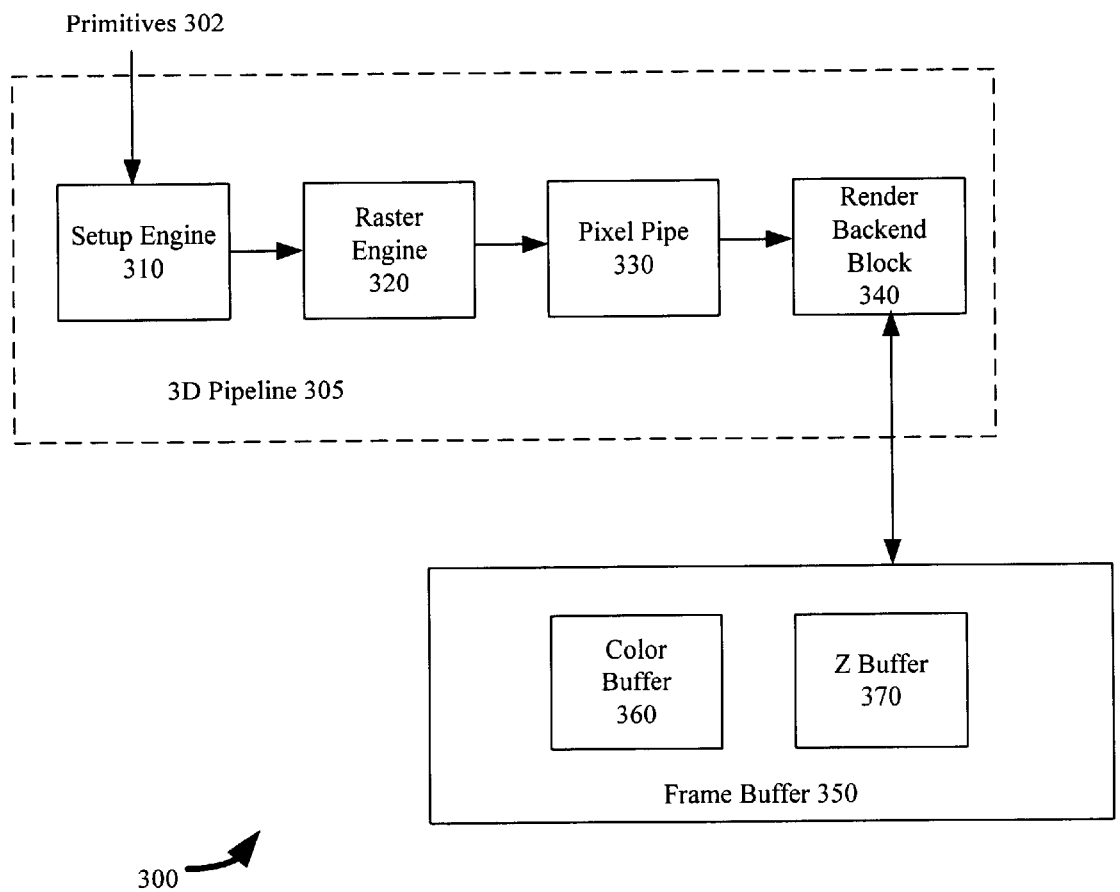
FIG. 6 illustrates a block diagram of a video graphics circuit in accordance with the present invention.

FIG. 6 illustrates a circuit 300 that includes a 3D pipeline 305 operably coupled to a frame buffer 350. The 3D pipeline 305 preferably includes a set-up engine 310, a raster engine 320, a pixel pipe 330, and a render backend block 340. The frame buffer 350 preferably includes a color buffer 360 that stores color information corresponding to pixels in a display frame, and a Z buffer 370 that stores corresponding Z values for the pixels included in the display frame. Preferably, the interface between the render backend block 340 and the Z buffer 370 includes the circuitry illustrated in FIG. 3, or utilizes the method illustrated in FIG. 5 such that Z information for pixels in the frame can be stored in a compressed format that reduces the overall memory bandwidth required to access Z information for the pixels.

Preferably, the 3D pipeline 305 is included in a video graphics integrated circuit that may also include two-dimensional graphics processing and other processing blocks that may effect the data stored within the frame buffer 350. Such an integrated circuit is preferably capable of, among other things, rendering three-dimensional video graphics images for display. More preferably, the interface circuitry between the render backend block 340 and any other blocks on the integrated circuit that require access to the Z information stored in the Z buffer 370 are coupled to the circuitry, or entity employing the methodology of the invention described herein such that the Z information in the Z buffer 370 can be stored in a compressed format.

The set-up engine 310 produces primitive slope information based on received graphics primitives 302. Preferably, the graphics primitives 302 are triangle primitives, which are commonly used in video graphics applications. Slope information corresponding to these primitives is provided to the raster engine 320, which is operably coupled to the set-up engine 310. The raster engine 320 generates pixel fragments from the primitive slope information. Preferably, each pixel fragment includes a color value, a set of coordinates indicating a pixel in the display frame to which the fragment corresponds, and a Z value for the fragment.

The raster engine 320 provides the pixel fragments to the pixel pipe 330, which is operably coupled to the raster engine 320. The pixel pipe 330 performs various operations that may modify the color of the pixel fragment as received from the raster engine 320. Such operations can include texture-mapping operations. The textured fragment resulting from the operations performed by the pixel pipe 330 are then passed to the render backend block 340 which is operably coupled to the pixel pipe 330 and the frame buffer 350.

The render backend block 350 blends textured fragments with corresponding pixels in the frame buffer 350 as determined by the set of coordinates for each textured fragment. The Z value for each textured fragment is used to blend the fragment with the currently stored pixel information. The retrieval of the Z value for the currently stored pixel information is preferably accomplished based on the circuitry of FIG. 3, or the methodology of FIG. 5.

The blending operations performed by the render backend block 340 are well known in the art, and the resulting pixel information produced by the render backend block 340 is stored back in the frame buffer 350. The frame buffer 350 can be accessed by display hardware to retrieve the pixel information for use in generating the display.

By compressing the Z information for a plurality of pixel blocks that make up a display frame, the memory bandwidth required to both fetch and store the Z information for the pixel blocks can be greatly reduced. This allows for faster processing of the video graphics pixels making up the frame, allowing for better overall performance of the video graphics circuitry.

It should be understood that the implementation of variations and modifications of the invention in its various aspects should be apparent to those of ordinary skill in the art, and that the invention is not limited to the specific embodiments described. It is therefore contemplated to cover by the present invention, any and all modifications, variations, or equivalents that fall within the spirit and scope of the basic underlying principles disclosed and claimed herein.

What is claimed is:

1. A method for controlling compressed Z information, comprising:

determining if Z information for a pixel block is present in a cache;

when the Z information for the pixel block is not present in the cache:

reading a Z mask value for the pixel block;

fetching the Z information for the pixel block wherein the Z mask value for the pixel block indicates a level of compression of the Z information; and decompressing the Z information when the Z mask value indicates the Z information for the pixel block is compressed.

2. The method of claim 1 further comprising: storing the Z information for the pixel block in the cache.

3. The method of claim 1 further comprising:

receiving coordinates corresponding to the pixel block of a frame, wherein the frame includes a plurality of pixel blocks, wherein each pixel block of the plurality of pixel blocks includes the Z information for a plurality of pixels, wherein the Z information for each pixel represents spatial depth of the pixel.

4. The method of claim 3 further comprises:
modifying Z information corresponding to at least one of the plurality of pixels in the pixel block;
when the Z information for the pixel block can be compressed to a level exceeding a compression threshold:
compressing the Z information for the pixel block to produce compressed Z information;
storing the compressed Z information in the Z buffer; and
updating the Z mask value to indicate compression level of the compressed Z information; and
when the Z information for the plurality of pixels cannot be compressed to the level exceeding the compression threshold:
storing the Z information for the pixel block in the Z buffer; and
updating the Z mask value to indicate the Z information is uncompressed.

5. The method of claim 1 wherein reading the Z mask value further comprises:
when the Z mask value for the pixel block indicates that the Z information for the pixel block is cleared Z information, storing a clear value in the cache as the Z value corresponding to each of the plurality of pixels.

6. The method of claim 1, wherein reading the Z mask value further comprises reading the Z mask value from a Z mask memory, wherein the Z mask memory stores a corresponding Z mask value for each pixel block of the frame.

7. The method of claim 6, wherein each Z mask value includes a plurality of bits, wherein the plurality of bits encodes the level of compression.

8. The method of claim 7, wherein the plurality of bits further comprises two bits, wherein encoded states of the two bits indicate four levels of compression.

9. The method of claim 8, wherein one level of the four levels of compression indicates no compression.

10. The method of claim 1 wherein the Z information is fetched for a Z buffer.

11. A processor for managing compressed Z information, comprising:
a processing module;
memory operably coupled to the processing module, wherein the memory stores operating instructions that, when executed by the processing module, cause the processor to perform the functions of:
determining if Z information for a pixel block is present in a cache;
when the Z information for the pixel block is not present in the cache:
reading a Z mask value for the pixel block;
fetching the Z information for the pixel block wherein the Z mask value for the pixel block indicates a level of compression of the Z information; and
decompressing the Z information when the Z mask value indicates the Z information for the pixel block is compressed.

12. The processor of claim 11, wherein the memory includes operating instructions that, when executed, cause the processing module to store the Z information for the pixel block in the cache.

13. The processor of claim 11, wherein the memory includes operating instructions that, when executed, cause the processing module to read the Z mask value such that when the Z mask value for the pixel block indicates that the Z information for the pixel block is cleared Z information, the processor stores a clear value in the cache as the Z value corresponding to each of the plurality of pixels.

14. The processor of claim 11, wherein the memory includes operating instructions that, when executed, cause the processing module to receive coordinates corresponding to the pixel block of a frame, wherein the frame includes a plurality of pixel blocks, wherein each pixel block of the plurality of pixel blocks includes Z information for a plurality of pixels, wherein the Z information for each pixel represents spatial depth of the pixel.

15. The processor of claim 14, wherein the memory includes operating instructions that, when executed, cause the processing module to perform the additional functions of:
modifying Z information corresponding to at least one of the plurality of pixels in the pixel block;
when the Z information for the pixel block can be compressed to a level exceeding a compression threshold:
compressing the Z information for the pixel block to produce compressed Z information;
storing the compressed Z information in the Z buffer; and
updating the Z mask value to indicate compression level of the compressed Z information; and
when the Z information for the plurality of pixels cannot be compressed to the level exceeding the compression threshold:
storing the Z information for the pixel block in the Z buffer; and
updating the Z mask value to indicate the Z information is uncompressed.

16. The processor of claim 11, wherein the memory includes operating instructions that, when executed, cause the processing module to read the Z mask value by referencing a lookup table that stores a Z mask value for each pixel block of the frame.

17. The processor of claim 16, wherein each Z mask value includes a plurality of bits, wherein the plurality of bits encodes the level of compression.

18. The processor 17, wherein the plurality of bits further comprises two bits, wherein encoded states of the two bits indicate four levels of compression.

19. The processor of claim 18, wherein one level of the four levels of compression indicates no compression.

20. A method for controlling compressed Z information, comprising:
reading a Z mask value for a pixel block;
fetching Z information for the pixel block, wherein the Z mask value for the pixel block indicates a level of compression of the Z information; and
decompressing the Z information when the Z mask value indicates the Z information for the pixel block is compressed.

21. The method of claim 20 further comprising:
storing the Z information for the pixel block in a cache.

22. The method of claim 20 further comprising:
receiving coordinates corresponding to the pixel block of a frame, wherein the frame includes a plurality of pixel blocks, wherein each pixel block of the plurality of pixel blocks includes the Z information for a plurality of pixels, wherein the Z information for each pixel represents spatial depth of the pixel.

23. The method of claim 22 further comprises:
modifying Z information corresponding to at least one of the plurality of pixels in the pixel block;

when the Z information for the pixel block can be compressed to a level exceeding a compression threshold:
  compressing the Z information for the pixel block to produce compressed Z information;
  storing the compressed Z information in a Z buffer; and
  updating the Z mask value to indicate compression level of the compressed Z information; and
when the Z information for the plurality of pixels cannot be compressed to the level exceeding the compression threshold:
  storing the Z information for the pixel block in the Z buffer; and
  updating the Z mask value to indicate the Z information is uncompressed.

24. The method of claim 20, wherein reading the Z mask value further comprises:
  when the Z mask value for the pixel block indicates that the Z information for the pixel block is cleared Z information, storing a clear value in the cache as the Z value corresponding to each of the plurality of pixels.

25. The method of claim 20, wherein reading the Z mask value further comprises reading the Z mask value from a Z mask memory, wherein the Z mask memory stores a corresponding Z mask value for each pixel block of the frame.

26. A processor for managing compressed Z information, comprising:
  a processing module;
  memory operably coupled to the processing module, wherein the memory stores operating instructions that, when executed by the processing module, cause the processor to perform the functions of:
    reading a Z mask value for the pixel block;
    fetching the Z information for the pixel block wherein the Z mask value for the pixel block indicates a level of compression of the Z information; and
    decompressing the Z information when the Z mask value indicates the Z information for the pixel block is compressed.

27. The processor of claim 26, wherein the memory includes operating instructions that, when executed, cause the processing module to store the Z information for the pixel block in the cache.

28. The processor of claim 26, wherein the memory includes operating instructions that, when executed, cause the processing module to read the Z mask value such that when the Z mask value for the pixel block indicates that the Z information for the pixel block is cleared Z information, the processor stores a clear value in the cache as the Z value corresponding to each of the plurality of pixels.

29. The processor of claim 26, wherein the memory includes operating instructions that, when executed, cause the processing module to receive coordinates corresponding to the pixel block of a frame, wherein the frame includes a plurality of pixel blocks, wherein each pixel block of the plurality of pixel blocks includes Z information for a plurality of pixels, wherein the Z information for each pixel represents spatial depth of the pixel.

30. The processor of claim 29, wherein the memory includes operating instructions that, when executed, cause the processing module to perform the additional functions of:
  modifying Z information corresponding to at least one of the plurality of pixels in the pixel block;
  when the Z information for the pixel block can be compressed to a level exceeding a compression threshold:
    compressing the Z information for the pixel block to produce compressed Z information;
    storing the compressed Z information in the Z buffer; and
    updating the Z mask value to indicate compression level of the compressed Z information; and
  when the Z information for the plurality of pixels cannot be compressed to the level exceeding the compression threshold:
    storing the Z information for the pixel block in the Z buffer; and
    updating the Z mask value to indicate the Z information is uncompressed.

31. The processor of claim 26, wherein the memory includes operating instructions that, when executed, cause the processing module to read the Z mask value by referencing a lookup table that stores a Z mask value for each pixel block of the frame.

* * * * *